United States Patent
Goldfarb et al.

(10) Patent No.: US 8,124,485 B1
(45) Date of Patent: Feb. 28, 2012

(54) MOLECULAR SPACER LAYER FOR SEMICONDUCTOR OXIDE SURFACE AND HIGH-K DIELECTRIC STACK

(75) Inventors: Dario L. Goldfarb, Armonk, NY (US); Hemanth N. Jagannathan, Armonk, NY (US); Dirk Pfeiffer, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/032,909

(22) Filed: Feb. 23, 2011

(51) Int. Cl.
*H01L 21/00* (2006.01)
(52) U.S. Cl. ........................ 438/287; 438/780
(58) Field of Classification Search .................. 438/287, 438/780, 781
See application file for complete search history.

(56) References Cited

U.S. PATENT DOCUMENTS

| | | | |
|---|---|---|---|
| 6,887,332 | B1 | 5/2005 | Kagan et al. |
| 7,285,440 | B2 | 10/2007 | Dimitrakopoulos et al. |
| 7,390,703 | B2 | 6/2008 | Klauk et al. |
| 7,410,820 | B2 | 8/2008 | Jacobs et al. |
| 2005/0189536 | A1 | 9/2005 | Zschieschang et al. |
| 2005/0191801 | A1 | 9/2005 | Zschieschang et al. |
| 2006/0108320 | A1* | 5/2006 | Lazovsky et al. .............. 216/2 |
| 2006/0154400 | A1* | 7/2006 | Choi et al. .................... 438/49 |
| 2007/0032091 | A1 | 2/2007 | Heald et al. |
| 2007/0166989 | A1 | 7/2007 | Fresco et al. |
| 2008/0105866 | A1 | 5/2008 | Jeong et al. |
| 2008/0275273 | A1 | 11/2008 | Effenberger et al. |
| 2009/0061506 | A1 | 3/2009 | Hofer et al. |
| 2009/0093133 | A1 | 4/2009 | Doris et al. |
| 2009/0117277 | A1 | 5/2009 | Afzali-Ardakani et al. |
| 2009/0188558 | A1 | 7/2009 | Jen et al. |

* cited by examiner

*Primary Examiner* — Richard A. Booth
(74) *Attorney, Agent, or Firm* — Robert J. Eichelburg; The Law Offices of Robert J. Eichelburg

(57) ABSTRACT

A process for defining a functional area in a semiconductor device comprising a semiconductor substrate contiguous with a gate dielectric layer whose dielectric constant is higher than silicon oxide and an oxide capping layer positioned on the gate dielectric layer that reduces gate leakage comprises applying an organo phosphorous SAM to the oxide capping layer, adhering an organic photoresist layer to the organo phosphorous SAM, defining the functional area by imaging the photoresist layer with a functional area image, developing and removing the functional area image in the photoresist to form a functional area image on the organo phosphorous SAM, and removing the functional area image on the organo phosphorous SAM to form a functional area image on the oxide capping layer. In various embodiments, the gate dielectric layer comprises a $HfO_2$ dielectric layer, the oxide capping layer comprises a $La_2O_3$ layer, and the organo phosphorous acid comprises an alkyl phosphonic acid, a carboxylic acid-terminated alkyl phosphonic acid, and mixtures thereof.

20 Claims, 12 Drawing Sheets

MOLECULAR SPACER LAYER FOR SEMICONDUCTOR OXIDE SURFACE AND HIGH-K DIELECTRIC STACK

FIELD OF THE INVENTION

The field of the invention comprises molecular spacer layers for semiconductor oxide surfaces.

BACKGROUND OF THE INVENTION AND RELATED ART

For the successful realization of advanced semiconductor devices, novel materials are expected to be introduced in future IC technology nodes (45 nm node and beyond) such as high-k dielectric elements and metal gate electrodes. Several integration schemes have been proposed and are currently practiced in order to build functional devices containing new gate dielectric materials such as $HfO_2$, having a higher dielectric constant than $SiO_2$. Also, it has been demonstrated that the use of a thin (about 2 to about 10 Å) oxide capping layer (e.g., containing Group IIA, IIIA and IIIB elements such as La2O3, MgO, SrO, $Y_2O_3$, $Al_2O_3$ or BaO) on top of $HfO_2$ enhances the threshold voltage tunability of the device with reduced gate leakage and adds extra channel control, formerly afforded by the low-k dielectric material. In particular, a La2O3 layer as a cap on an $HfO_2$ layer provides optimum performance and threshold voltage control.

In order to define nFET and pFET functional areas at the chip level, selective removal of the ultrathin (sub-1 nm) $La_2O_3$ layer is required. Lithographic patterning with a ca. 2000 Å thick photoimageable layer (photoresist) is used towards that end, optionally utilizing an intermediate layer between $La_2O_3$ and photoresist consisting of a ca. 500 Å thick developable Bottom AntiReflective Coating (dBARC) for resist adhesion and reflectivity control purposes. Wet etch of the exposed La2O3 regions to expose the substrate electrode (HfO2 layer) is performed with diluted hydrochloric acid (HCl), while the regions masked by the patterned resist/BARC areas remain intact. The HCl wet etchant concentration is adjusted to prevent the attack/removal of the HfO2 layer. Finally, the photoresist/BARC layers are removed with a $N_2H_2$ plasma dry etch process.

Two fundamental problems affect the reliability of the sequence described above. First, the contact between aqueous photoresist developer (TMAH 0.26N) and the surface of the lanthanide ($La_2O_3$) layer introduces a slight dissolution of the lanthanide layer, thus affecting the reworkability of the entire patterning scheme. Ideally, no $La_2O_3$ should be removed during the photoresist patterning step. Second, the utilization of $N_2H_2$ plasma for the removal of thick resist and dBARC layers is prone to defectivity formation in the form of residual strings, blobs, stains and particulates that originate from the interaction between the plasma and the thick organic material layers.

Therefore, the use of an ultrathin adhesion layer that replaces the thick dBARC is required to prevent contact of the resist developer with the $La_2O_3$ surface and to eliminate a source of post-etch defects, while still providing good adhesion between the imaging layer and the $La_2O_3$ surface.

SUMMARY OF THE INVENTION

Accordingly, the present invention provides structures, articles of manufacture and processes that address these needs to not only provide advantages over the related art, but also to substantially obviate one or more of the foregoing and other limitations and disadvantages of the related art including, but not limited to the slight dissolution of the lanthanide layer as well as defectivity formation in the form of residual strings, blobs, stains and particulates that originate from the interaction between the plasma and the thick organic material layers upon removal of thick resist and dBARC layers.

Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the composition, structure and process of the invention comprise a phosphonic acid mono molecular layer interposed between the surfaces of the lanthanide layer and the photoimageable layer (photoresist).

We do this by first applying the phosphonic acid to the $La_2O_3$ layer already supported on an underlying $HfO_2$ layer. The phosphonic acid selectively binds to the $La_2O_3$ and self-assembles onto the $La_2O_3$ surface in an orderly fashion to leave a hydrophobic layer of molecular thickness also known as a self-assembled monolayer (SAM). We then apply the photoimageable layer (photoresist) to this hydrophobic layer, i.e., SAM.

This SAM is chemically resistant to developer attack and creates a barrier that prevents or minimizes dissolution of the $La_2O_3$ layer and underlying $HfO_2$ layer, while providing good adhesion of the photoresist layer to the $La_2O_3$ layer. In another context the $La_2O_3$ material comprises lanthanide oxides in general, i.e., oxides of elements having atomic numbers 57 to 71. Additional oxides covered in the present invention include oxides that have a higher dielectric constant compared to $SiO_2$ such as the oxides of Group IVB metals (Ti, Zr) and $HfO_2$ equivalents.

BRIEF DESCRIPTION OF THE DRAWINGS

The accompanying drawings also set out the invention and are incorporated in and constitute a part of this specification and are included to illustrate various embodiments of the invention and together with this specification also serve to explain the principles of the invention.

FIGS. 16a-17b comprise photomicrographs illustrating film quality of 248 nm resist on an La$_2$O$_3$/SAM layer.

DETAILED DESCRIPTION

To achieve these and other advantages, and in accordance with the purpose of this invention as embodied and broadly described herein, the following detailed embodiments comprise disclosed examples that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention.

In one embodiment, the invention comprises a process for defining a functional area in a semiconductor device comprising a semiconductor substrate contiguous with a gate dielectric layer whose dielectric constant is higher than SiO$_2$ and an oxide capping layer positioned on the gate dielectric layer that changes the threshold voltage of the device and reduces gate leakage comprises applying an organo phosphorous SAM to the oxide capping layer, adhering an organic photoresist layer to the organo phosphorous SAM, defining the functional area by imaging the photoresist layer with a functional area image, either by exposing the organic photoresist through a mask or by projecting an image onto the photo resist in a manner well known in the art. The resist in this regard may comprise either a positive working resist or a negative working resist, also known in the art.

In another embodiment, the invention comprises a process for defining a functional area in a semiconductor device comprising a semiconductor substrate contiguous with a gate dielectric layer whose dielectric constant is higher than silicon oxide and an oxide capping layer positioned on the gate dielectric layer that modulates the threshold voltage of the device and reduces gate leakage comprising applying an organo phosphorous SAM to the oxide capping layer, adhering an organic photoresist layer to the organo phosphorous SAM, defining the functional area by imaging the photoresist layer with a functional area image, developing and removing the functional area image in the photoresist to form a functional area image on the organo phosphorous SAM, removing the functional area image on the organo phosphorous SAM to form a functional area image on the oxide capping layer. The invention also comprises a product produced by this process.

This is followed by developing and removing the functional area image in the photoresist to form a functional area image on the organo phosphorous SAM, and removing the functional area image on the organo phosphorous SAM to form a functional area image on the oxide capping layer.

In a further embodiment, the invention comprises a process for defining pFET or nFET functional areas in a semiconductor device comprising a silicon oxide wafer having a gate dielectric layer whose dielectric constant is higher than silicon oxide and an oxide capping layer that modulates the threshold voltage and reduces gate leakage positioned on said gate dielectric layer, by applying an organo phosphorous SAM to the oxide capping layer, adhering an organic photoresist layer to the organo phosphorous SAM, defining the pFET or nFET functional areas by means of a photo mask positioned on the photoresist, exposing the photoresist through the mask to expose the pFET or nFET functional areas to obtain exposed photoresist images of the pFET or nFET functional areas in the resist, developing and removing the images of the pFET or nFET functional areas in the resist to form the pFET or nFET functional areas on the organo phosphorous SAM, and removing the images of the pFET or nFET functional areas on the organo phosphorous SAM to form pFET or nFET functional area images on the oxide capping layer.

The invention also comprises products made by the foregoing processes because the products obtained may vary slightly from structure to structure because of processing conditions. As noted, the invention comprises placing a phosphonic acid mono molecular layer, SAM, between the surfaces of a La2O3 layer and a photoimageable layer (photoresist) in the fabrication of a microcircuit device in order to overcome the various difficulties encountered with related art processes.

The SAM of the present invention comprises alkyl phosphonic acid molecules [CH$_3$ (CH2)n P(O)(OH)$_2$], which have the ability to chemically bind to the La$_2$O$_3$ surface and perpendicularly align with respect to the substrate plane of the device. The SAM is formed by spin-coating or dipping with contact times ranging from about 10 sec. to about 100 sec. SAM dipping or casting formulations can be based on common organic solvents such as alkoxy-alcohols, ketones and esters. Typical alkyl phosphonic acid concentrations in organic solvent range from about 0.01% to about 1% by weight. Useful alkyl chain lengths are about 5<n<17. In our description of the invention in the specification and drawings we also refer to "n," by which we mean the value of "n" in the alkyl phosphonic acid molecules [CH$_3$(CH2)n P(O)(OH)$_2$] and the corresponding carboxylic acid terminated alkyl phosphonic acid molecules, and as such describe the repeating methylene groups in the alkyl chain. Once deposited, the SAM can be optionally baked, however the adhesion properties of the SAM are not significantly affected by such extra step. Advantageous properties of the SAM in relation to La$_2$O$_3$ processing comprise:

a. short deposition time by dipping (<1 min); Post-apply bake (PAB) not strictly needed;

b. ultrathin layer (<10 A) minimizes strip time and post-rework defectivity;

c. provides good resist adhesion, no undercut;

d. excellent barrier towards developer and HCl attack to $La_2O_3$.

We have also established the effect on contact angle (CA) for various SAM parameters and $La_2O_3$ processing conditions including:

a. alkyl chain length;

b. contact time with SAM-containing organic solvent c. SAM concentration in organic solvent;

d. contact time with developer (TMAH 0.26N);

e. contact time with HCl (different dilutions).

As to the effect of HCl contact time, we have conducted the following experiments:

Dissolve CH3(CH2)nP(O)(OH)2 in 2-EtOEtOH—15 g solution

1. Filter
2. Immerse $La_2O_3$ sample (60 s)
3. Rinse with isopropyl alcohol (IPA)
4. Post-apply bake (PAB) 100 C/60 S
5. Immerse in HCl:water, 1:1 and 1:20 (variable concentration & time)
6. Rinse DI H20 (deionized water)
7. Measure CA

| Thickness: 6Å | | n = 11 |
|---|---|---|
| HCl t(s) | dil 1:1 CA | dil 1:20 CA |
| 0 | 104 | 104 |
| 10 | 104 | 104 |
| 25 | 104 | 104 |
| 60 | 104 | 104 |
| 150 | 104 | 104 |
| 350 | 104 | 104 |

We measure the static water contact angles (CA) in the foregoing examples with a Gardco Goniometer by methods well known in the art.

The foregoing examples show that the HCl wet etch has less tendency to penetrate through the SAM layer and attack the $La_2O_3$ layer than the developer.

We then conduct a series of experiments to determine the $La_2O_3$ contact angle after resist processing.

| | Processing | CA |
|---|---|---|
| 1. | $La_2O_3$ | 30 |
| 2. | $La_2O_3$/SAM C18 (18 carbon atom alkyl group, n = 17) | 103 |
| 3. | $La_2O_3$/no SAM/Resist develop (TMAH 0.26 N 60 s) | 65 |
| 4. | $La_2O_3$/SAM C18/Resist develop (TMAH 0.26 N 60 s) | 97 |
| 5. | $La_2O_3$/SAM C18/Resist dev (TMAH 0.26 N 60 s)/ $La_2O_3$ etch (HCl 1:20 4 min) | 95 |

Observations

1. Hydrophilic surface
2. Hydrophobic surface
3. Resist cracking/peeling
4. No attack to $La_2O_3$
5. No attack to $La_2O_3$ We observe only a slight decrease in CA on the SAM layer after resist development. This indicates the monolayer has not been attacked or removed by the aqueous developer. Also, there was a negligible change in the CA after contact with the $La_2O_3$ etch aqueous solution. Accordingly, the SAM protects the $La_2O_3$ layer against HCl attack. The next step in the process comprises dry etching the SAM layer to access the $La_2O_3$ surface.

We evaluated the casting solvent wetting of solutions of photoresist polymer 3435 on 18 carbon atom SAMs (n=17) in the following experiments.

| Casting Solvent | P3435 polymer soluble | solvent wetting on C18 | P3435/solvent film forming on C18 | b.p. (° C.) |
|---|---|---|---|---|
| 4-methyl-2-pentanol | Low | good | NA | 132 |
| 1-butanol | Low | good | NA | 118 |
| 1-pentanol | Low | good | NA | 137 |
| butyl acetate | High | marginal | good | 125 |
| 3-pentanone | High | marginal | no test (b.p. too low) | 102 |
| 4-heptanone | High | marginal | good | 145 |
| ethyl lactate | High | poor | bad | 154 |
| 1-methoxy-2-propanol | High | poor | bad | 118 |
| PGMEA | High | poor | bad | 145 |
| Cyclohexanone | High | poor | bad | 155 |
| diethyl malonate | High | very poor | bad | 199 |
| g-butyrolactone | High | very poor | bad | 204 |

These experiments identify a subset of casting solvents that provide good SAM surface wetting, and show selected organic solvents commonly used in photoresist formulations allowing good film casting on $La_2O_3$ surfaces modified with SAMs. A state-of-the-art 248 nm photoresist supplied by Tokyo Ohka Kogyo (TOK) under the trade name of TDUR-P3435 was utilized.

Figure 1:
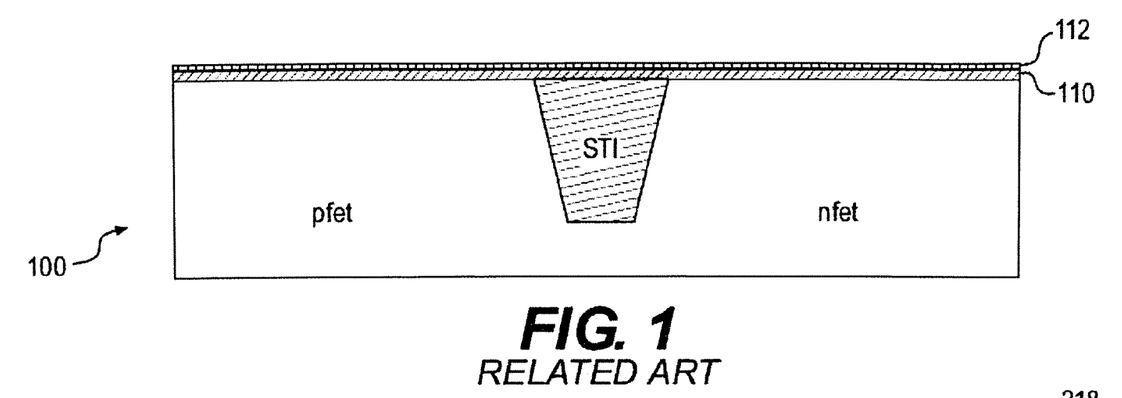
FIGS. 1 through 4 illustrate progressive steps for manufacturing a related art semiconductor device, showing the device in side elevation cross-sections during assembly.
Figure 2:
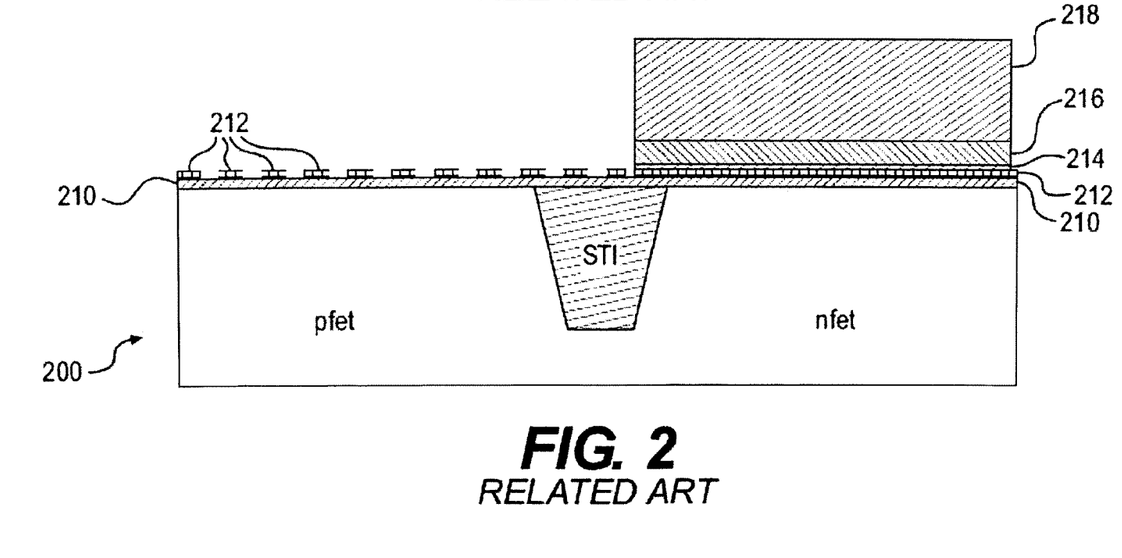

Referring to the Figures, FIG. 1, illustrates a related art semiconductor device 100, i.e., a field effect transistor having pFET (pfet) and nFET (nfet) regions on either side of an STI (shallow trench isolation) region, and an $HfO_2$ layer 110 capped with an $La_2O_3$ layer 112. FIG. 2 illustrates a related art semiconductor device 200 having pFET (pfet) and nFET (nfet) regions on either side of an STI (shallow trench isolation) region, including an $HFO_2$ layer 210 capped with an $La_2O_3$ layer 212. We obtain the device of FIG. 2 by further processing the device of FIG. 1 by placing a dBARC layer 214 and resist layer 216 on $La_2O_3$ layer 214 by spin coating followed by an OK level mask 218 over the resist layer 216. We then expose and develop the device of FIG. 2. This leads to the problem where the contact between aqueous photoresist developer (TMAH 0.26N) and the surface of the lanthanide ($La_2O_3$) layer introduces a slight dissolution of the lanthanide layer, thus affecting the reworkability of the entire patterning scheme. Ideally, no $La_2O_3$ should be removed during the photoresist patterning step.

Figure 3:
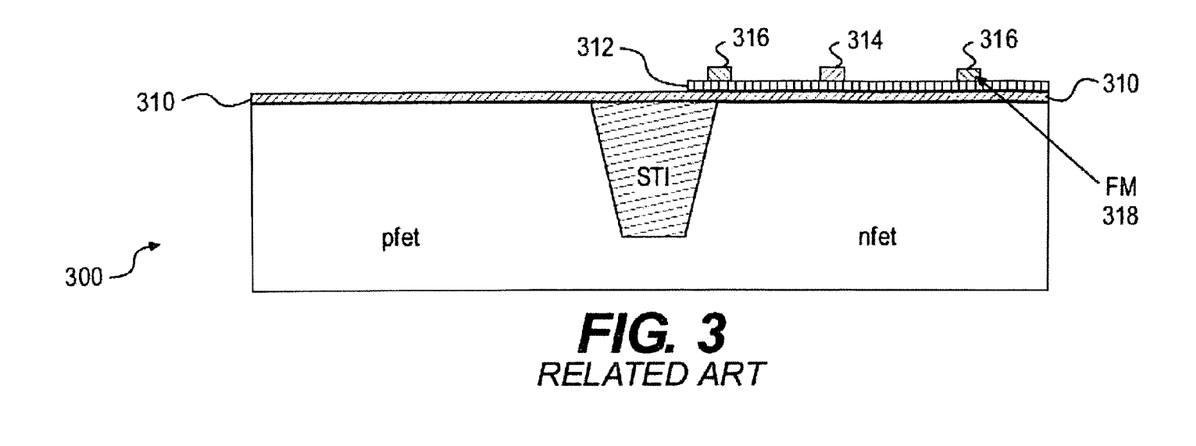

FIG. 3 illustrates a related art semiconductor device 300 having pFET (pfet) and nFET (nfet) regions on either side of an STI (shallow trench isolation) region, including an $HFO_2$ layer 310 capped with an $La_2O_3$ layer 312. We obtain the device of FIG. 3 by further processing the device of FIG. 2 by stripping portions of the resist layer and dBARC layer by means of a $N_2H_2$ plasma leaving resist segments 316 and dBARC segment 314.

This leads to the second problem in the related art where the utilization of $N_2H_2$ plasma for the removal of a thick resist and dBARC layers is prone to defectivity formation in the form of residual strings, blobs, stains and particulates that originate from the interaction between the plasma and thick organic material layers. This so called 'foreign material' (FM) is illustrated in FIG. 3 as generic defect segments 318.

Figure 4:
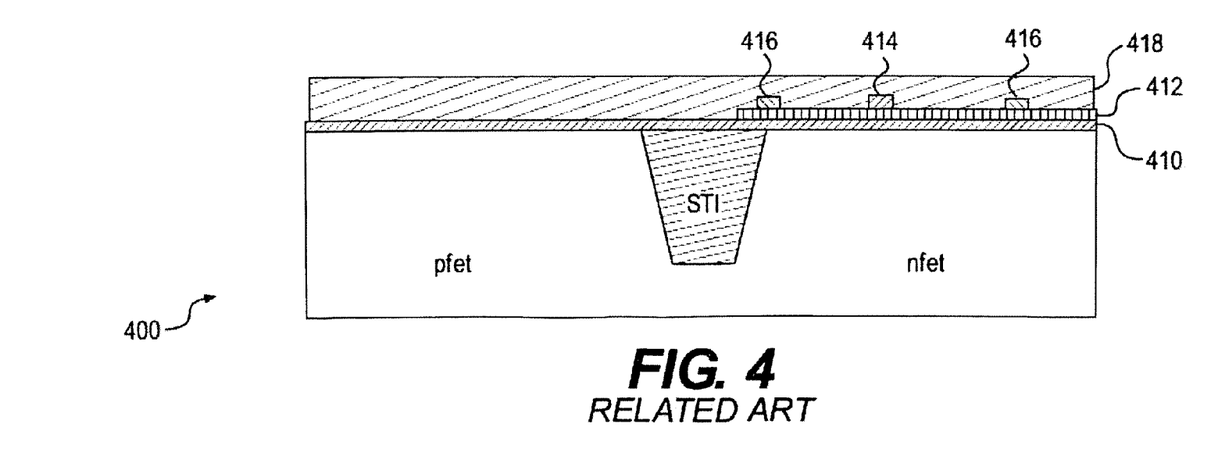

FIG. 4 illustrates a related art semiconductor device 400 having pFET (pfet) and nFET (nfet) regions on either side of an STI (shallow trench isolation) region, including an $HFO_2$ layer 410 capped with an $La_2O_3$ layer 412. We obtain the device of FIG. 4 by further processing the device of FIG. 3 by capping the $HfO_2$ layer 410 and $La_2O_3$ layer 412 with a 70 Å TiN layer 418, leaving encapsulated resist segments 416 and dBARC segment 414. The presence of encapsulated resist segments 416 and dBARC segment 414 at the interface between the capping TiN layer 418 and the $HfO_2$ layer 410 and $La_2O_3$ layer 412 is highly undesirable as it negatively affects the performance of the HKMG device.

Figure 5:
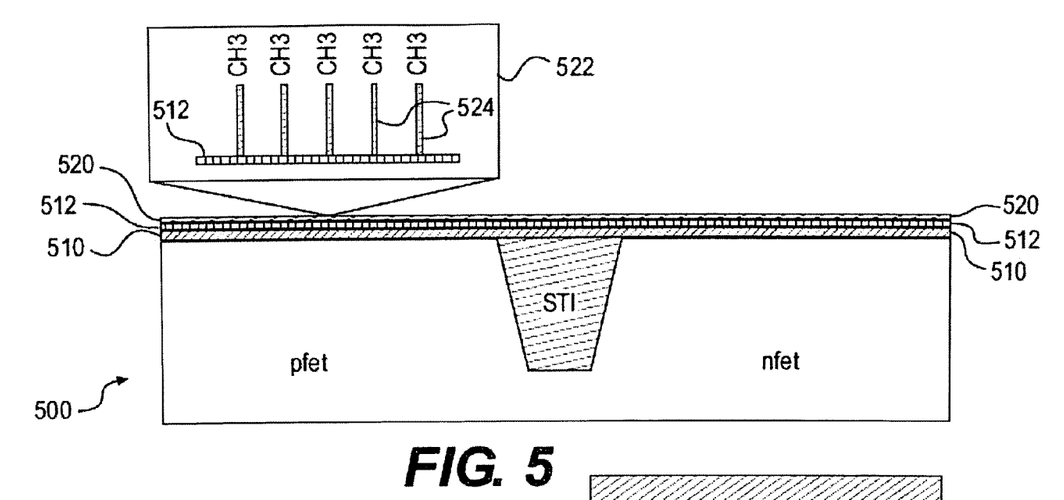
FIGS. 5 and 6 comprise illustrations of progressive steps for manufacturing a semiconductor device according to the invention using alkyl phosphonic acid SAMs for $La_2O_3$ processing and show the device in side elevation cross-sections during assembly.

FIG. 5 illustrates a device 500 of the invention comprising pFET (pfet) and nFET (nfet) regions on either side of an STI (shallow trench isolation) region, including an $HfO_2$ layer 510 capped with a 4 Å $La_2O_3$ layer 512. We coat $La_2O_3$ layer 512 with a SAM layer 520, a portion of which is illustrated further by an enlarged fragmentary cross-section 522 showing individual SAM molecules 524 attached to and extending away from $La_2O_3$ layer 512.

Figure 6:
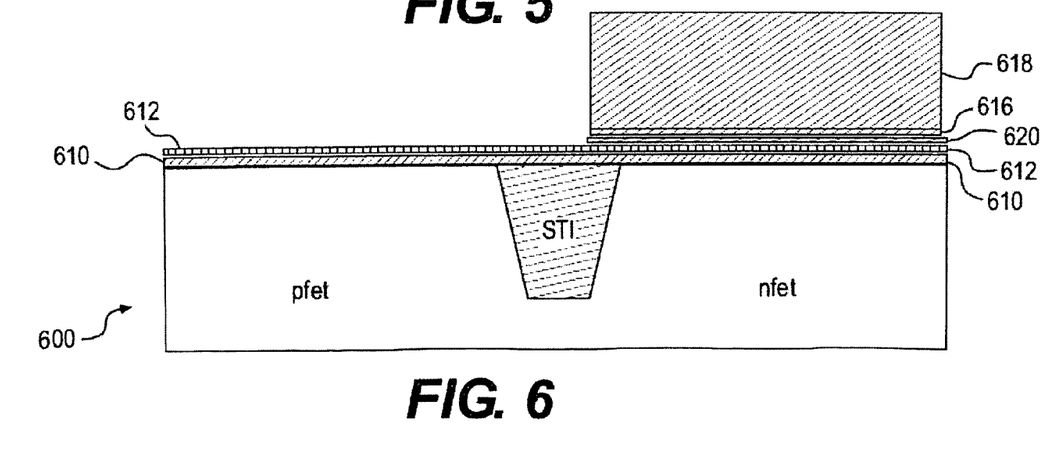

FIG. 6 illustrates a device 600 of the invention comprising pFET (pfet) and nFET (nfet) regions on either side of an STI (shallow trench isolation) region, including an $HfO_2$ layer 610 capped with an $La_2O_3$ layer 612 coated with a SAM layer 620 produced according to the description of the device in FIG. 5. We then apply a photoresist layer 616 by a spin coating process and an OK level mask 618 on top of the resist, followed by exposing and developing the resist 616 and then removing the SAM layer 620 under the exposed and developed resist layer by means of an $N_2H_2$ plasma. This process leaves part of $La_2O_3$ layer 612 without any layers coated on it to project over the pFET region and part of the STI region of device 600.

Figure 7:
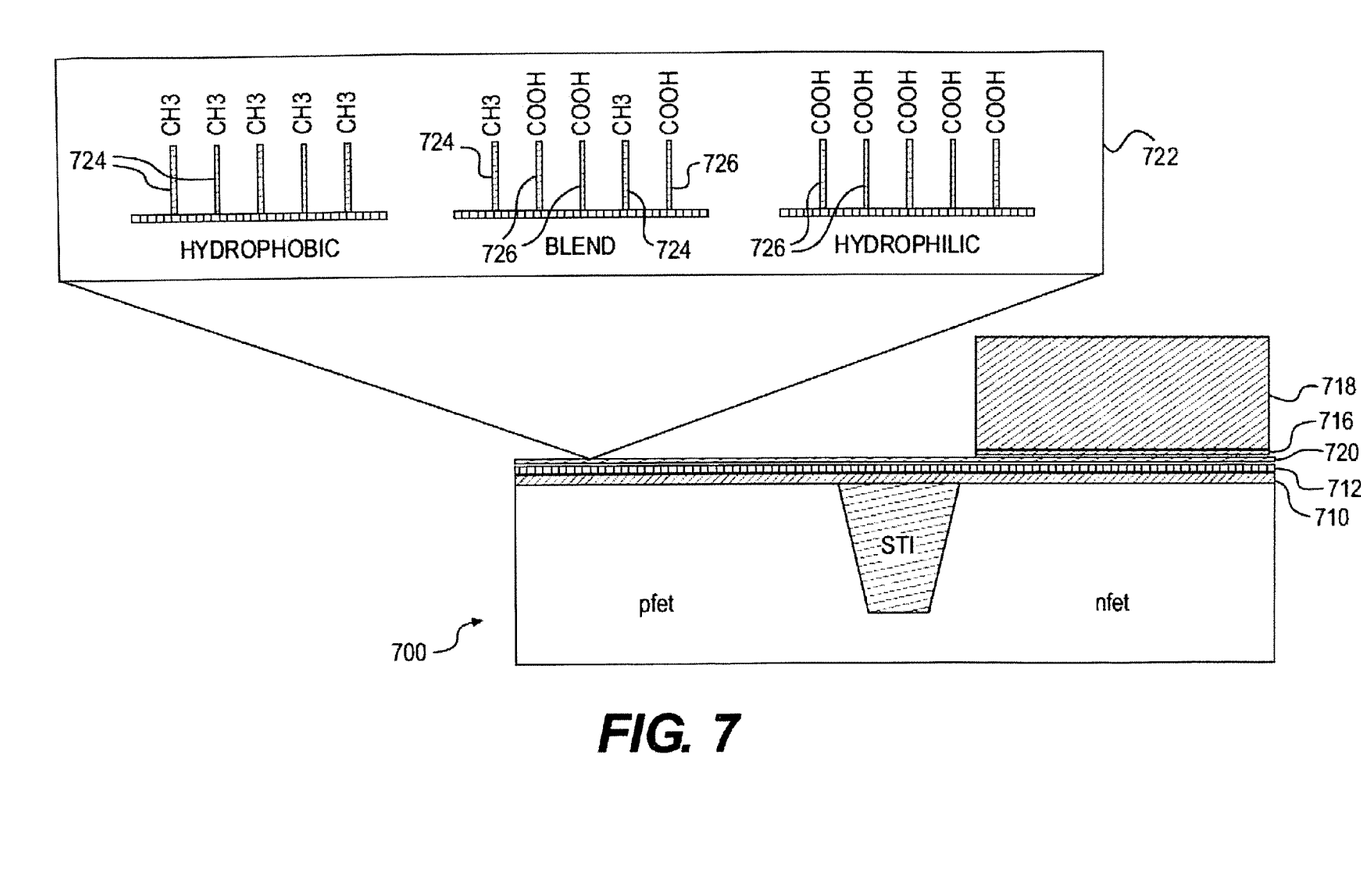
FIG. 7 comprises a side elevation in cross-section showing the manufacture of a semiconductor device according to the invention to illustrate surface tuning the alkyl phosphonic acid SAMs by means of alkyl and/or carboxyl terminal groups to modify the hydrophobic/hydrophilic characteristics of the SAM.

FIG. 7 illustrates a device 700 of the invention. We fabricate the device 700 in substantially the same way as the device 600 by means of resist 716 and mask 718 through which we expose the device, develop it, and then partially remove the mask and resist. Device 700 comprises pFET (pfet) and nFET (nfet) regions on either side of an STI (shallow trench isolation) region, including an $HfO_2$ layer 710 capped with an $La_2O_3$ layer 712. We coat $La_2O_3$ layer 712 with a SAM layer 720, a portion of which is illustrated further by an enlarged fragmentary cross-section 722 showing individual hydrophobic SAM molecules 724 and hydrophilic SAM molecules 726 attached to and extending away from $La_2O_3$ layer 712. The arrangement of hydrophobic SAM molecules 724 and hydrophilic SAM molecules 726 illustrated in 722 depicts how surface energy can be modulated with blends of SAMs having hydrophilic and hydrophobic end groups. Exemplary types of carboxyl-terminated phosphonic acids are $HOOC(CH2)nP(O)(OH)_2$ with $1<n<17$, such as 2-phosphonoacetic acid (n=1), 3-Phosphonopropionic acid (n=2), 6-Phosphonohexanoic acid (n=5), 11-Phosphonoundecanoic acid (n=10), 16-Phosphonohexadecanoic acid (n=15)

Figure 8:
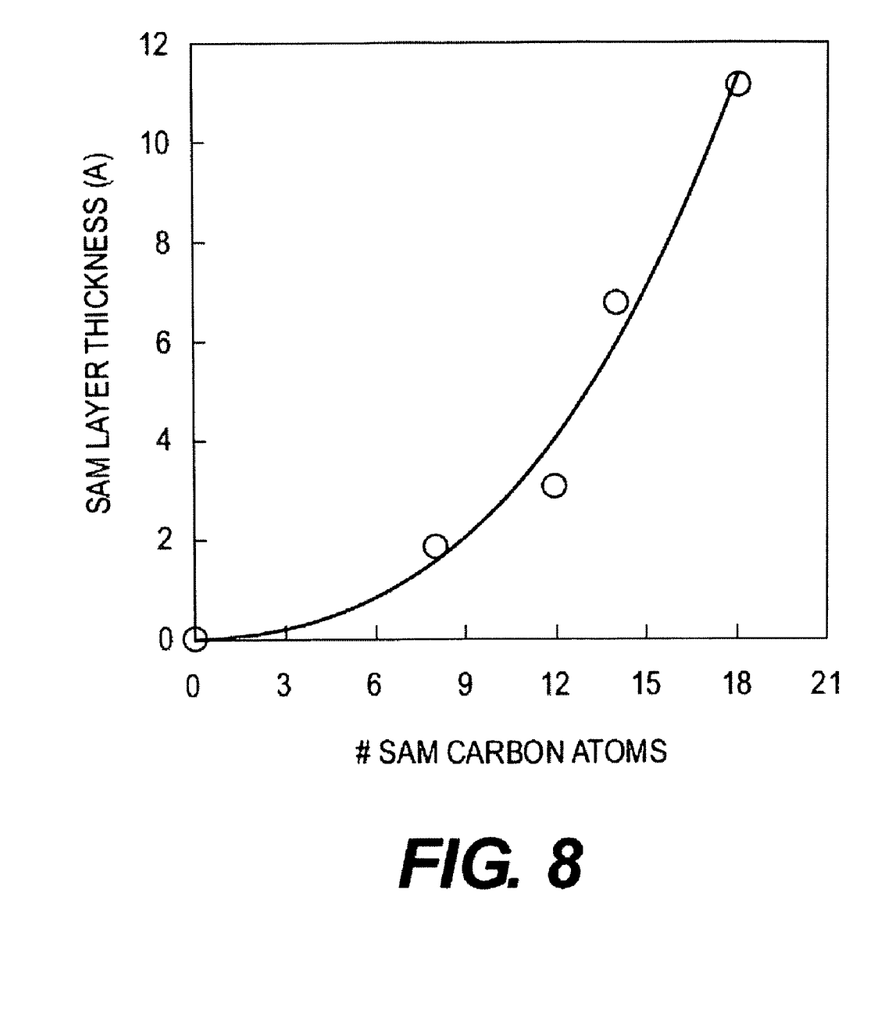
FIG. 8 comprises a plot of the layer thickness in Angstroms of various alkyl phosphonic acid SAMs used according to the present invention compared to the number of carbon atoms in each SAM to illustrate the effect of the latter on thickness.

FIG. 8 comprises a plot of SAM layer thickness in Å vs. carbon atoms in the SAM, i.e., SAM alkyl chain length. We obtained these data from a device 800 prepared as in FIGS. 6 and 7 having an 18 Å $HfO_2$ layer and a 6 Å $La_2O_3$ layer. We coated the $La_2O_3$ layer with an alkyl phosphonic acid $CH_3(CH2)_nP(O)(OH)_2$ (SAM) solution at a concentration of 1% by weight in 2-ethoxyethanol (EtOEtOH) by dipping the device in the solution for about 90 seconds, after which we gave the coated device an IPA rinse (isopropyl alcohol) and PAB (Post Apply Bake) at about 110° C. for about 60 seconds. We then measured the thickness of the dried SAM by means of VASE (Variable Angle Spectroscopic Elipsometry).

The data of FIG. 8 show that increasing alkyl chain length of the SAM increases the thickness of the dried SAM coating.

Figure 9:
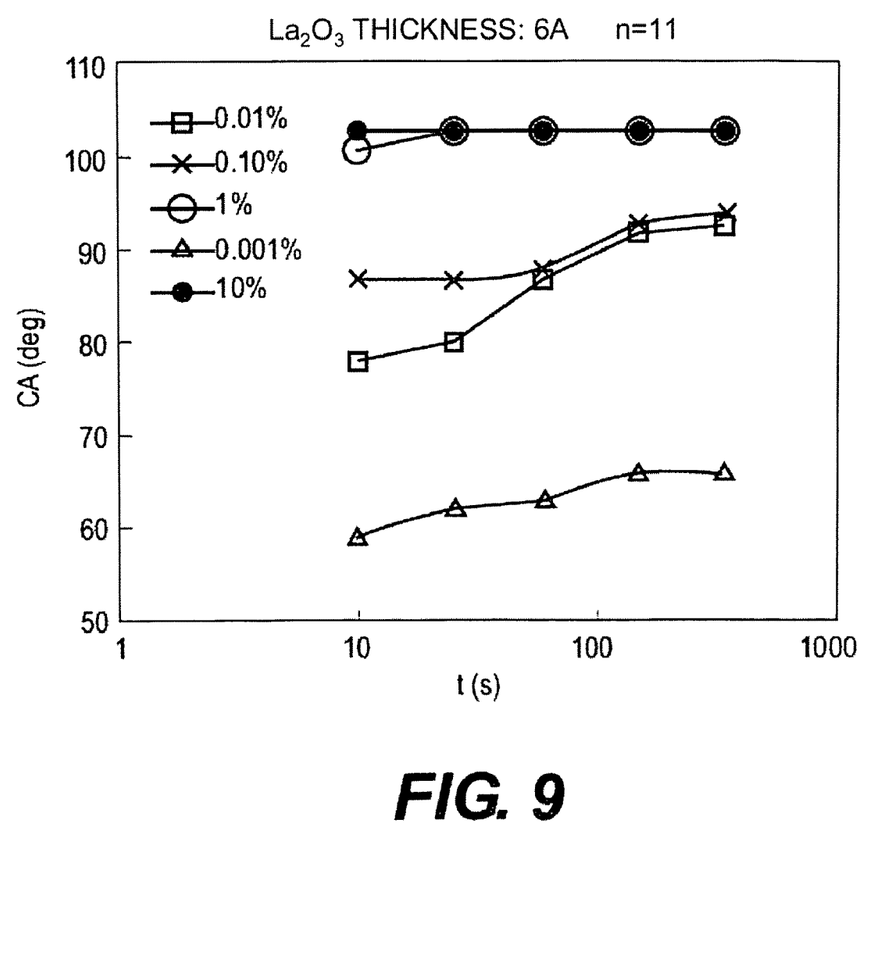
FIG. 9 comprises a plot of the contact angle (CA) in degrees obtained with aliphatic alkyl phosphonic acid SAMs having varying alkyl chain lengths used according to the present invention and dissolved in a solvent to form a solution compared to varying times in the solvent used to apply the SAM to an La$_2$O$_3$ to illustrate the effect of the latter on CA.

FIG. 9 comprises a plot of contact angle (CA) in degrees vs. various concentrations of alkyl phosphonic acid $CH_3(CH2)nP(O)(OH)_2$ (SAM) in a solvent, 2-EtOEtOH. (We measure static water contact angles (CA) with a G2 Contact Angle Measuring System (Krüss)). We prepare a device in substantially the same manner as the device used to obtain the data of FIG. 8, however employ 15 g. of the solution of the SAM, filter the solution, immerse a 6 Å $La_2O_3$ sample in the filtered solution for about 15 seconds, followed by an IPA rinse, but without employing a PAB. We then measure CA as noted above. The data plotted in FIG. 9 show higher concentrations of the SAM results in faster coverage of the $La_2O_3$ surface, allowing higher contact angle values to be achieved with shorter processing times. This results in more effective masking of the $La_2O_3$ layer with the SAM material.

Figure 10:
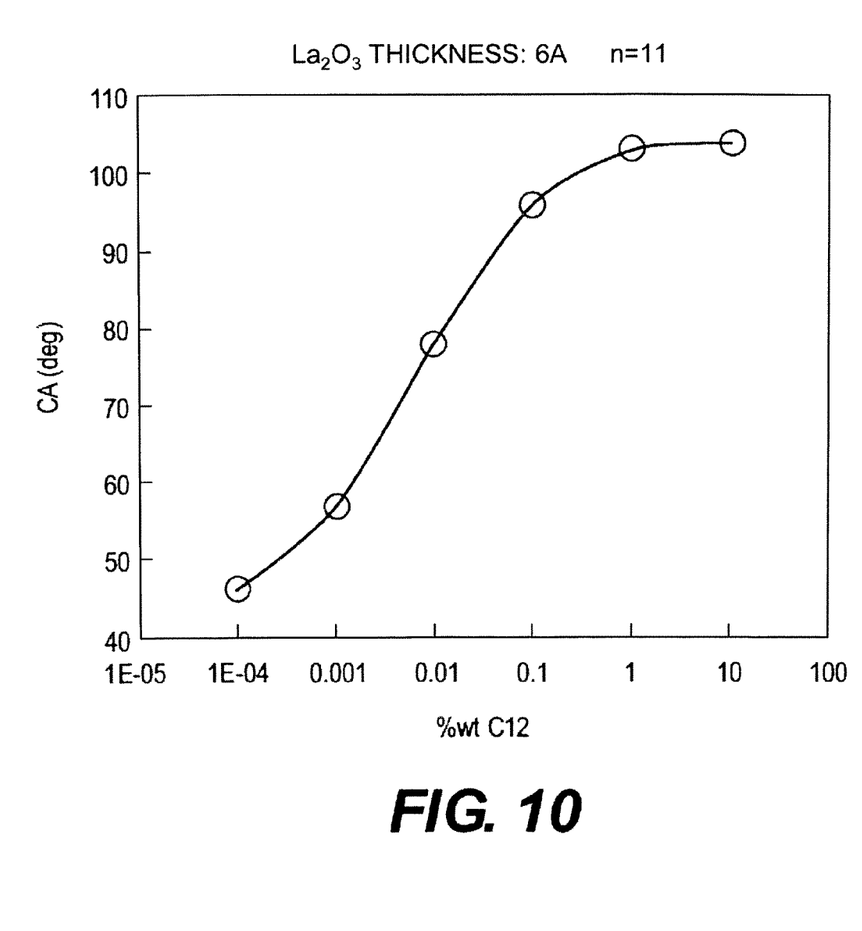
FIG. 10 comprises a plot of the contact angle (CA) in degrees obtained with an aliphatic alkyl phosphonic acid SAM used according to the present invention and dissolved in a solvent compared to varying SAM concentrations in the solvent to illustrate the effect of the latter on CA.

FIG. 10 comprises a plot of contact angle (CA) in degrees vs. increasing concentrations of SAM, employing an alkyl phosphonic acid $CH_3(CH2)nP(O)(OH)_2$ (SAM) in a solvent, 2-EtOEtOH. We measure static water contact angles (CA) in the same way as previously described. We prepare a device in substantially the same manner as the device used to obtain the data of FIG. 8, however employ 15 g. of the solution of the SAM, filter the solution, immerse a 6 Å $La_2O_3$ sample in the filtered solution for about 15 seconds, followed by an IPA rinse, but without employing a PAB. We then measure CA as noted above. The data plotted in FIG. 10 show higher concentrations of SAM material results in greater values for CA for a given immersion time. These data illustrate increasing the additive concentration increases CA.

Figure 11:
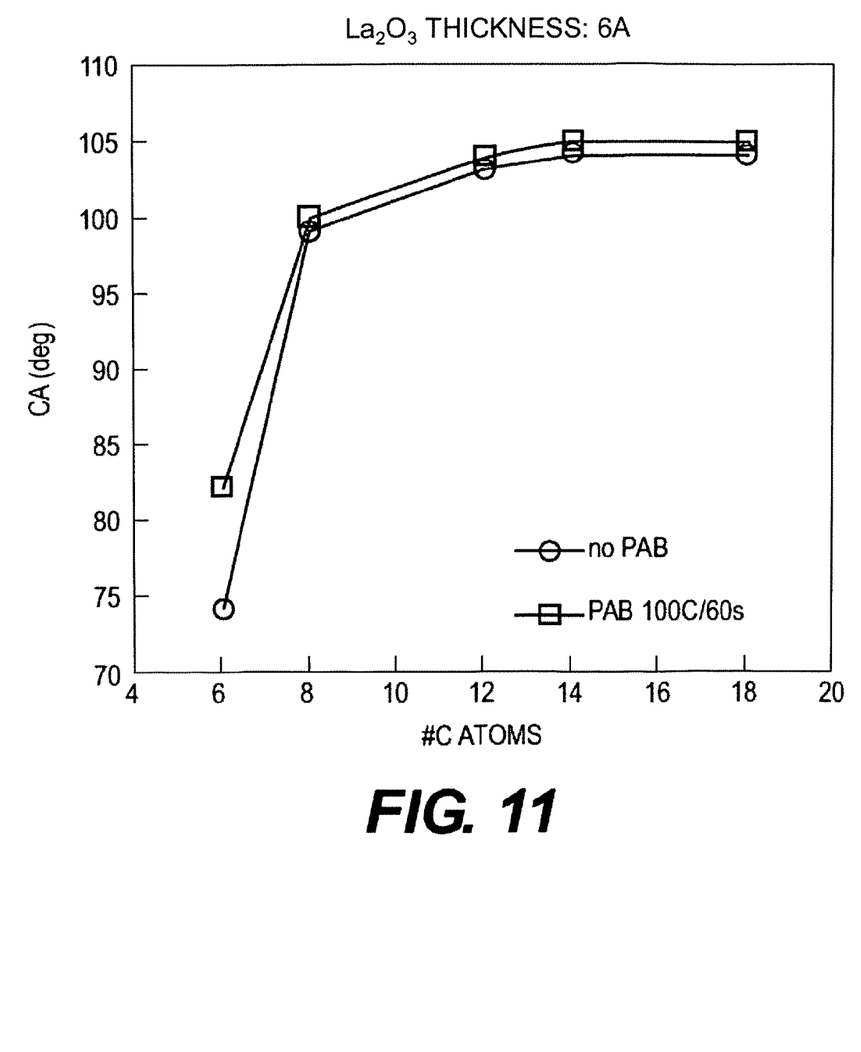
FIG. 11 comprises a plot of the contact angle (CA) in degrees obtained with an aliphatic alkyl phosphonic acid SAM used according to the present invention and compared to the number of carbon atoms in the alkyl chain of the SAM to illustrate the effect of the latter on CA.

FIG. 11 comprises a plot of contact angle (CA) in degrees vs. SAMs having varying alkyl chain length, employing an alkyl phosphonic acid $CH_3(CH2)nP(O)(OH)_2$ (SAM) in a solvent, 2-EtOEtOH. We measure static water contact angles (CA) in the same way as previously described. We prepare a device in substantially the same manner as the device used to obtain the data of FIG. 8, however employ 15 g. of the solution of the SAM, filter the solution, immerse a 6 Å $La_2O_3$ sample in the filtered solution for about 60 seconds, followed by an IPA rinse, with two sets of samples, one in which we used a PAB of 100 C for 60 sec., and another set of samples without employing the PAB. We then measure CA as noted above. The data plotted in FIG. 11 show longer alkyl chains result in higher contact angle values; more effective masking of the $La_2O_3$ surface with thicker SAM and that SAM thickness is not significantly affected by the PAB step.

Figure 12:
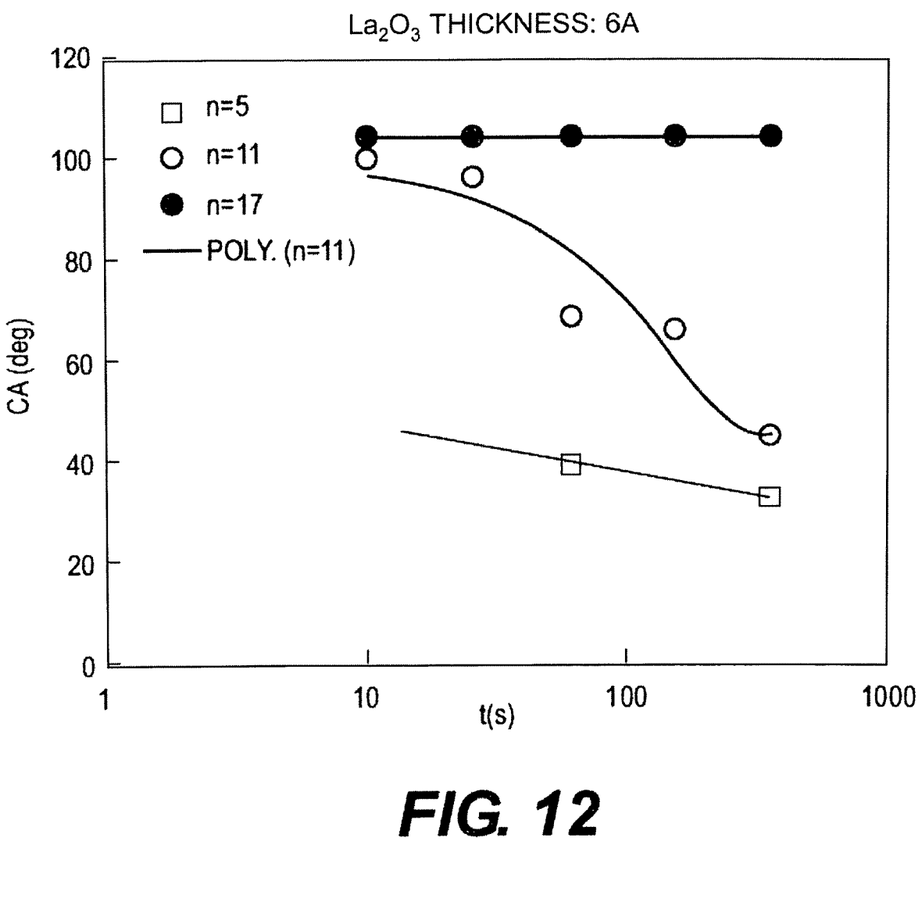
FIG. 12 comprises a plot of the contact angle (CA) in degrees obtained with alkyl phosphonic acid SAMs used according to the present invention and having alkyl groups that vary in chain length compared to the time of exposure to a photolithographic developer to illustrate the effect of the latter on CA.

FIG. 12 comprises a plot of contact angle (CA) in degrees with SAMs having varying alkyl chain lengths vs. time of immersion of the prepared sample in AD-10 developer (tetramethylammonium hydroxide TMAH 0.26N in aqueous solution) We employ an alkyl phosphonic acid $CH_3(CH2)nP(O)(OH)_2$ (SAM) in a solvent, 2-EtOEtOH. We measure static water contact angles (CA) in the same way as previously described. We prepare a device in substantially the same manner as the device used to obtain the data of FIG. 8, however employ 15 g. of the solution of the SAM, filter the solution, immerse a 6 Å $La_2O_3$ sample in the filtered solution for about 60 seconds, followed by an IPA rinse and a PAB of 100 C for 60 sec. The data plotted in FIG. 12 show longer alkyl chains result in higher contact angle values and a thicker SAM layer resulting, in more protection against developer/DI water rinse attack to the $La_2O_3$ layer.

Figure 13:
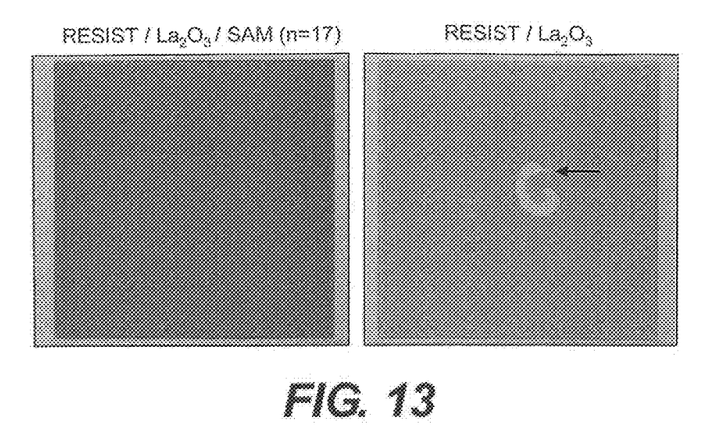
FIGS. 13 and 14 comprise photomicrographs 10 microns× 10 microns produced according to the present invention to illustrate resist adhesion to a SAM layer on an La$_2$O$_3$ surface compared to La$_2$O$_3$ surfaces without the SAM layer.
Figure 14:
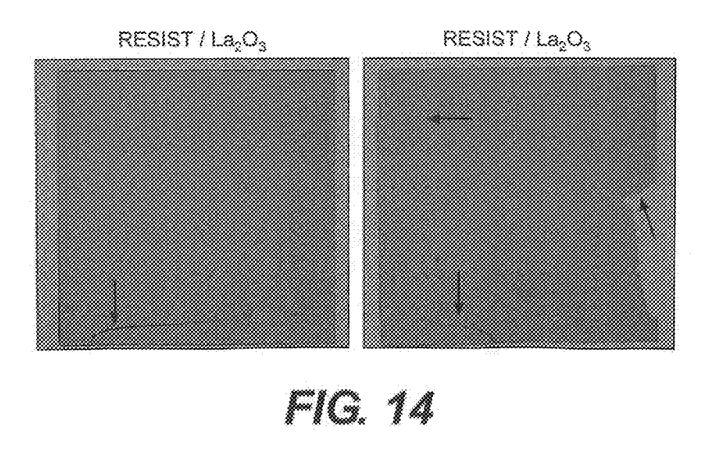

FIGS. 13 and 14 comprise photomicrographs, 10 micron× 10 micron, illustrating photoresist adhesion to SAM as compared to $La_2O_3$. We employed a 193 nm resist (EX FARM platform) patterned on $La_2O_3$ and SAM surfaces by contact printing the resist on the surfaces. Good adhesion was provided by A SAM having an 18 carbon alkyl chain (n=17) despite a very high contact angle of 103°. The far right and bottom left panels show adhesion failure (cracking, peeling, delamination) observed when patterning the same resist on an $La_2O_3$ surface (no SAM).

Figure 15A:
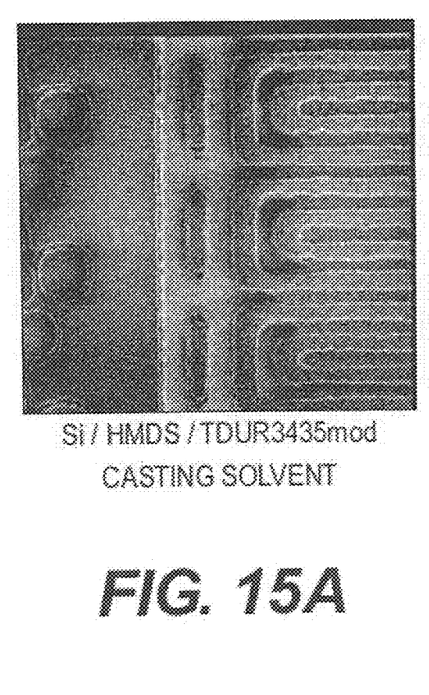
FIGS. 15A, 15B, 15C, comprise 3 photomicrographs comparing patterning of a 248 nm resist on an La$_2$O$_3$ layer produced according to the present invention (FIG. 15 A) with a 248 nm resist on an La$_2$O$_3$ layer coated with SAM layers, the FIG. 15B "A" image obtained where the SAM is dissolved in 4-heptanone and the FIG. C image obtained where the SAM is dissolved in 4M2P/4-heptanone (60:40)
Figure 15B:
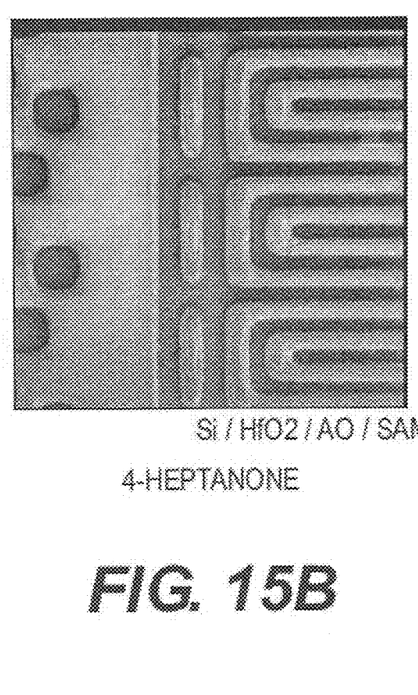
Figure 15C:
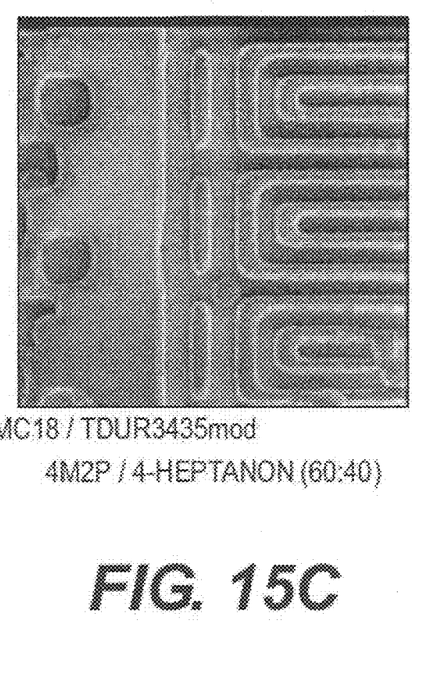

FIG. 15A, comprises a photomicrograph illustrating 248 nm POR resist on a silicon layer and FIG. 15B, and FIG. 15C an $La_2O_3$ layer coated with a SAM layer. We prepared these samples by precipitating a POR resist (TDUR3435) into hexane, filtering it and drying it. We then redissolved the dried precipitate in an alternative casting solvent, 4-heptanone. And coated the sample substrates, The coated substrates were dried and then exposed to a pattern using 248 nm DUV (MERLIN M2 reticle) Wafer #1 (FIG. 15A) comprised the control: Si/HMDS (hexamethyldisilazane, HMDS used as a standard priming agent for the silicon surface) TDUR3435mod1 layer (mod1=modified resist sample). Wafer #2, (FIG. 15B, and FIG. 15C) comprised: Si/$HfO_2$/$La_2O_3$/SAM (18 carbon alkyl, n=17)TDUR3435mod1 layers. DEFMON2 in the caption over the far right photomicrograph=defect monitor area. 4M2P in the caption under the far right photomicrograph=4-methyl-2-pentanol solvent. FIG. 15 shows no adhesion failure, cracking, or peeling observed when patterning over the SAM layer.

Figure 16A:
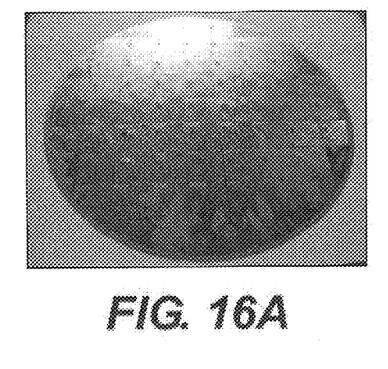
Figure 16B:
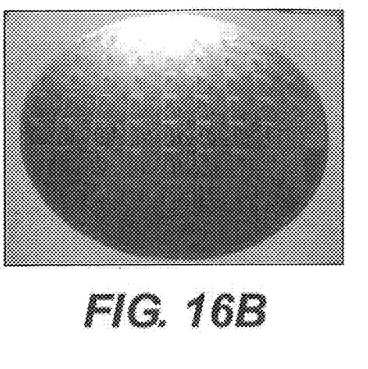
Figure 17A:
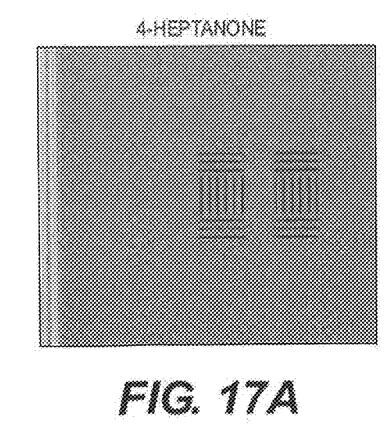
Figure 17B:
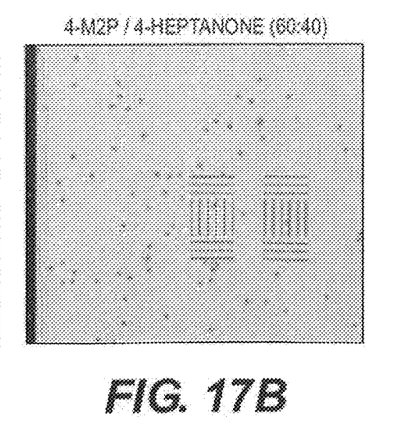

FIGS. 16 and 17 comprise illustrations of 248 nm POR resist on an $La_2O_3$/SAM layer.
These micrographs show photoresist patterns with minimum feature size of 150 nm.
FIG. 16 illustrates the dispensed resist volume needs to be tuned for high contact angle surface. Due to the high contact angle and low surface energy of the SAM layer it is more difficult for the photoresist formulation to wet the SAM-coated substrate, therefore larger photoresist dispense volume needs to be employed. FIG. 17 illustrates the casting solvent blend needs to be optimized for high contact angle surface. In the case where an increase of the photoresist dispense volume is not enough to compensate for the higher contact angle and low surface energy of the SAM layer, a different casting solvent blend needs to be utilized to provide adequate wetting.

The foregoing shows the advantages of using alkyl phosphonic acid SAMS for $La_2O_3$ processing and we have identified suitable material with good SAM formation properties on $La_2O_3$, namely;

$CH_3(CH_2)nP(O)(OH)_2$

The advantageous properties of the SAM in relation to $La_2O_3$ processing comprise:
  short deposition time by dipping (<1 min); PAB (post-apply bake) strictly needed;
  ultrathin layer (10 Å) minimizes strip time and post-rework defectivity;
  provides good resist adhesion, no undercut;
  excellent barrier towards developer and HCl attack to $La_2O_3$.

The foregoing also shows the effect the SAM on contact angle (CA) for various SAM parameters and $La_2O_3$ processing conditions such as:
  alkyl chain length;
  contact time with additive (SAM);
  additive (SAM) concentration;
  contact time with developer (TMAH 0.26N);
  contact time with HCl (different dilutions).

In one embodiment, therefore, the invention comprise a process for defining a functional area in a semiconductor device comprising a semiconductor substrate contiguous with a gate dielectric layer whose dielectric constant is higher than the semiconductor substrate, with an oxide capping layer positioned on the gate dielectric layer that modulates the threshold voltage and reduces gate leakage comprising applying an organo phosphorous SAM to the oxide capping layer, adhering an organic photoresist layer to the organo phosphorous SAM, defining the functional area by imaging the photoresist layer with a functional area image, developing and removing the functional area image in the photoresist to form a functional area image on the organo phosphorous SAM, removing the functional area image on the organo phosphorous SAM to form a functional area image on the oxide capping layer.

In another embodiment, the invention comprises a process for defining pFET or nFET functional areas in a semiconductor device comprising a silicon oxide wafer having a gate dielectric layer whose dielectric constant is higher than silicon oxide and an oxide capping layer that modulates the threshold voltage and reduces gate leakage positioned on the gate dielectric layer, comprising applying an organo phosphorous SAM to the oxide capping layer, adhering an organic photoresist layer to the organo phosphorous SAM, defining the pFET or nFET functional areas by means of a photo mask positioned on the photoresist, exposing the photoresist through the mask to expose the pFET or nFET functional areas to obtain exposed photoresist images of the pFET or nFET functional areas in the resist, developing and removing the images of the pFET or nFET functional areas in the resist to form the pFET or nFET functional areas on the organo phosphorous SAM, and removing the images of the pFET or nFET functional areas on the organo phosphorous SAM to form pFET or nFET functional area images on the oxide capping layer.

In these processes the semiconductor device may comprise of a field effect transistor (FET). The gate dielectric layer may comprise a dielectric layer selected from the oxides of the elements comprising the Group IV B metals and mixtures thereof. Furthermore, the gate dielectric layer may comprise of dielectrics having a higher dielectric constant than $SiO_2$ such as $HfO_2$ dielectric layer. The oxide capping layer may be selected from the oxides of the elements comprising the Group IIA metals, Group IIIA metals, Group IIIB metals and the lanthanide elements having atomic numbers from 57-71 and mixtures of the oxides. In another embodiment the oxide capping layer may be selected from the oxides comprising $La_2O_3$, MgO, SrO, $Y_2O_3$, $Al_2O_3$, and BaO and mixtures of the oxides. The Group IV B metals, Group IIA metals, Group IIIA metals, and Group IIIB metals comprise those metals from the Periodic Table of the Elements, IUPAC Form. References to other elements or metals also refer to the IUPAC Form.

Throughout this specification, abstract of the disclosure, and in the drawings, the inventors have set out equivalents, including without limitation, equivalent elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" in any claim or as applied to any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, wherein "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as issued and pending patents that amendments to this written description or this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A process for defining a functional area in a semiconductor device comprising a semiconductor substrate contiguous with a gate dielectric layer whose dielectric constant is higher than silicon oxide and an oxide capping layer positioned on said gate dielectric layer that modulates the threshold voltage of the device and reduces gate leakage comprising applying an organo phosphorous SAM to said oxide capping layer, adhering an organic photoresist layer to said organo phosphorous SAM, defining said functional area by imaging said photoresist layer with a functional area image, developing and removing said functional area image in said photoresist to form a functional area image on said organo phosphorous SAM, removing said functional area image on said organo phosphorous SAM to form a functional area image on said oxide capping layer.

2. A process according to claim 1 for defining pFET or nFET functional areas in a semiconductor device comprising a silicon oxide wafer having a gate dielectric layer whose dielectric constant is higher than silicon oxide and an oxide capping layer that modulates the threshold voltage and reduces gate leakage positioned on said gate dielectric layer, comprising applying an organo phosphorous SAM to said oxide capping layer, adhering an organic photoresist layer to said organo phosphorous SAM, defining said pFET or nFET functional areas by means of a photo mask positioned on said photoresist, exposing said photoresist through said mask to expose said pFET or nFET functional areas to obtain exposed photoresist images of said pFET or nFET functional areas in said resist, developing and removing said images of said pFET or nFET functional areas in said resist to form said pFET or nFET functional areas on said organo phosphorous SAM, and removing said images of said pFET or nFET functional areas on said organo phosphorous SAM to form pFET or nFET functional area images on said oxide capping layer.

3. The process of claim 1 wherein said semiconductor device comprises a field effect transistor (FET).

4. The process of claim 2 wherein said semiconductor device comprises a field effect transistor (FET).

5. The process of claim 1 wherein said gate dielectric layer comprises a dielectric layer selected from the oxides of the elements comprising the Group IV B metals and mixtures thereof.

6. The process of claim 1 wherein said gate dielectric layer comprises a dielectric having a higher dielectric constant than $SiO_2$.

7. The process of claim 1 wherein said gate dielectric layer comprises a $HfO_2$ dielectric layer.

8. The process of claim 2 wherein said gate dielectric layer comprises a dielectric layer selected from the oxides of the elements comprising the Group IV B metals and mixtures thereof.

9. The process of claim 2 wherein said gate dielectric layer comprises a $HfO_2$ dielectric layer.

10. The process of claim 1 wherein said oxide capping layer is selected from the oxides of the elements comprising the Group IIA metals, Group IIIA metals, Group IIIB metals and the lanthanide elements having atomic numbers from 57-71 and mixtures of said oxides.

11. The process of claim 1 wherein said oxide capping layer is selected from the oxides comprising $La_2O_3$, MgO, SrO, $Y_2O_3$, $Al_2O_3$, and BaO and mixtures of said oxides.

12. The process of claim 2 wherein said oxide capping layer is selected from the oxides of the elements comprising the Group IIA metals, Group IIIA metals, Group IIIB metals and the lanthanide elements having atomic numbers from 57-71 and mixtures of said oxides.

13. The process of claim 2 wherein said oxide capping layer is selected from the oxides comprising $La_2O_3$, MgO, SrO, $Y_2O_3$, $Al_2O_3$, and BaO and mixtures of said oxides.

14. The process of claim 1 wherein said oxide capping layer comprises a $La_2O_3$ layer.

15. The process of claim 2 wherein said oxide capping layer comprises a $La_2O_3$ layer.

16. The process of claim 10 wherein said oxide capping layer comprises a $La_2O_3$ layer.

17. The process of claim 12 wherein said oxide capping layer comprises a $La_2O_3$ layer.

18. The process of claim 1 wherein said organo phosphorous acid is selected from alkyl phosphonic acids, a carboxylic acid-terminated alkyl phosphonic acid, and mixtures thereof.

19. The process of claim 2 wherein said organo phosphorous acid is selected from alkyl phosphonic acids, a carboxylic acid-terminated alkyl phosphonic acid, and mixtures thereof.

20. A product made by the process of claim 1.

* * * * *

UNITED STATES PATENT AND TRADEMARK OFFICE
CERTIFICATE OF CORRECTION

| | | |
|---|---|---|
| PATENT NO. | : 8,124,485 B1 | |
| APPLICATION NO. | : 13/032909 | |
| DATED | : February 28, 2012 | |
| INVENTOR(S) | : Goldfarb et al. | |

It is certified that error appears in the above-identified patent and that said Letters Patent is hereby corrected as shown below:

On the cover page, please correct inventor's name and address from Hemanth N. Jagannathan, Armonk, NY (US) to --

Hemanth Jagannathan, Albany, NY (US)

Signed and Sealed this
Third Day of April, 2012

David J. Kappos
*Director of the United States Patent and Trademark Office*